US012451329B2

(12) United States Patent
Ventzek et al.

(10) Patent No.: US 12,451,329 B2
(45) Date of Patent: Oct. 21, 2025

(54) PLASMA PROCESSING APPARATUS WITH TUNABLE ELECTRICAL CHARACTERISTIC

(71) Applicant: Tokyo Electron Limited, Tokyo (JP)

(72) Inventors: Peter Lowell George Ventzek, Austin, TX (US); Mitsunori Ohata, Taiwa-cho (JP); Alok Ranjan, Austin, TX (US); Yun Han, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 984 days.

(21) Appl. No.: 17/337,067

(22) Filed: Jun. 2, 2021

(65) Prior Publication Data

US 2022/0392749 A1 Dec. 8, 2022

(51) Int. Cl.
*H01J 37/32* (2006.01)

(52) U.S. Cl.
CPC .. *H01J 37/32146* (2013.01); *H01J 37/32486* (2013.01)

(58) Field of Classification Search
CPC ............. C23C 16/4404; C23C 16/4581; H01J 37/32146; H01J 37/32174; H01J 37/32183; H01J 37/32477–32504; H01J 37/32559; H01J 2237/0268; H01L 21/68757
See application file for complete search history.

(56) References Cited

U.S. PATENT DOCUMENTS 7,578,258 B2 8/2009 Fischer
2006/0019477 A1 1/2006 Hanawa et al.
2017/0250056 A1 8/2017 Boswell et al.
2018/0233393 A1 8/2018 Liu et al.
2020/0075290 A1 3/2020 Kawasaki et al.
2020/0255938 A1 8/2020 Chong et al.

FOREIGN PATENT DOCUMENTS

KR 20170101779 A 9/2017
TW 201705185 A 2/2017
WO 03015267 A1 2/2003

OTHER PUBLICATIONS

International Searching Authority, "Notification of Transmittal of the International Search Report and the Written Opinion of the International Searching Authority, or the Declaration," International application No. PCT/US2022/031771, Sep. 27, 2023, 8 pages.
Tokyo Electron U.S. Holdings, Inc., "Notification of Examination Opinions", Taiwan Office Action, TW Application No. 111120592, dated Sep. 3, 2025, 8 pages.

*Primary Examiner* — Benjamin Kendall
(74) *Attorney, Agent, or Firm* — Slater Matsil, LLP

(57) ABSTRACT

A plasma processing apparatus includes a plasma processing chamber, a source power coupling element configured to generate plasma in an interior of the plasma processing chamber by coupling source power to the plasma processing chamber, a DC pulse generator configured to generate a DC pulse train at a DC pulse frequency, a substrate holder disposed in the interior of the plasma processing chamber, a DC coupling element coupled to the DC pulse generator, a DC current path including the DC coupling element, the plasma, and a reference potential node in a series configuration, the DC coupling element being configured to bias the substrate holder relative to the reference potential node using the DC pulse train, and a capacitive pre-coat layer disposed between the DC coupling element and the plasma. The capacitive pre-coat layer increases the RC time constant of the DC current path according to the DC pulse frequency.

20 Claims, 9 Drawing Sheets

PLASMA PROCESSING APPARATUS WITH TUNABLE ELECTRICAL CHARACTERISTIC

TECHNICAL FIELD

The present invention relates generally to plasma processing, and, in particular embodiments, to apparatuses and methods for plasma processing using a plasma processing apparatus with a tunable electrical characteristic.

BACKGROUND

Device formation within microelectronic workpieces may involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes.

Plasma processes are commonly used to form devices in microelectronic workpieces. For example, plasma etching and plasma deposition are common process steps during semiconductor device fabrication. A combination of source power and bias power may be used to generate and direct plasma during plasma processing. Sequences of direct current (DC) pulses may applied as bias voltage during plasma processes. Short DC pulse trains (i.e. sequences) may be used to increase the flux of high energy ions to a substrate.

Various parameters such as DC pulse frequency and duty ratios affect ion to radical ratios and other plasma parameters. The DC pulse frequency and duty ratios also affect charge buildup on the biased electrode. Charging of the biased electrode reduces the voltage which undesirably leads to reduced ion flux at the substrate. However, due to the dependence of the ion energy distribution function (IEDF) on the DC pulse frequency and the duty ratios, it is undesirable to manipulate these parameters to reduce substrate charging.

SUMMARY

In accordance with an embodiment of the invention, a plasma processing apparatus includes a plasma processing chamber, a source power coupling element configured to generate plasma in an interior of the plasma processing chamber by coupling source power to the plasma processing chamber, a DC pulse generator configured to generate a DC pulse train at a DC pulse frequency, a substrate holder disposed in the interior of the plasma processing chamber, a DC coupling element coupled to the DC pulse generator, a DC current path including the DC coupling element, the plasma, and a reference potential node in a series configuration, the DC coupling element being configured to bias the substrate holder relative to the reference potential node using the DC pulse train, and a capacitive pre-coat layer disposed between the DC coupling element and the plasma. The capacitive pre-coat layer increases the RC time constant of the DC current path according to the DC pulse frequency.

In accordance with another embodiment of the invention, a plasma processing apparatus includes a plasma processing chamber, a source power coupling element configured to generate plasma in an interior of the plasma processing chamber by coupling source power to the plasma processing chamber, a DC pulse generator configured to generate a DC pulse train including a DC pulse frequency, a substrate holder disposed in the interior of the plasma processing chamber, a DC coupling element coupled to the DC pulse generator, a DC current path including the DC coupling element, the plasma, and a reference potential node in a series configuration, and a tuning circuit coupled between the DC coupling element and the DC pulse generator. The DC coupling element is configured to bias the substrate holder relative to the reference potential node using the DC pulse train. The tuning circuit includes a variable capacitance. The tuning circuit is configured to tune an RC time constant of the DC current path by varying the variable capacitance according to the DC pulse frequency.

In accordance with still another embodiment of the invention, a method of tuning an electrical characteristic of a plasma processing chamber of a plasma processing apparatus includes determining a capacitance value from a range of capacitance values according to a DC pulse frequency of a DC pulse train to be generated by a DC pulse generator of the plasma processing apparatus, tuning the electrical characteristic by selecting the determined capacitance value using a tuning circuit coupled between a DC coupling element and the DC pulse generator, the tuning circuit including a variable capacitance tunable in the range of capacitance values, and biasing the DC coupling element relative to a reference potential node by generating the DC pulse train at the DC pulse frequency using the DC pulse generator.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
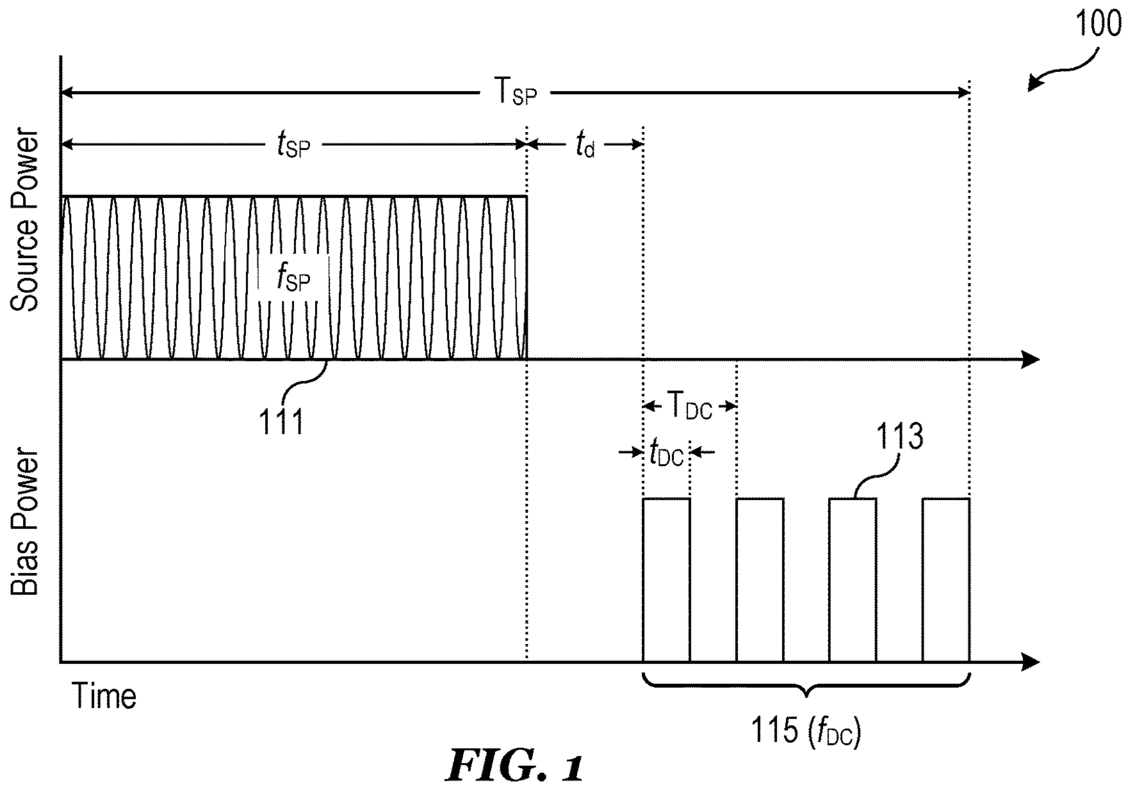
FIG. 1 illustrates a schematic timing diagram of an example plasma processing method in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

DC pulse trains may be useful for creating a large flux of high energy ions at a substrate. For example, DC pulse trains may accelerate ions toward the substrate by causing a voltage differential between the substrate and the plasma. Short DC pulse trains may be applied in an afterglow phase of a plasma as part of a pulsed plasma process (e.g. applying pulsed source and bias power). DC pulse trains may be useful for a variety of applications such as gate etching, patterning, high-aspect ratio contact (HARC) etching, memory fabrication.

However, the flux and energy of the ions is dependent on the ability to maintain the voltage differential between the plasma and the substrate surface. Charging at the substrate results in a reduction of this voltage differential and therefore lowers the effectiveness of an applied voltage over time. Therefore, the effects of each DC pulse must be controlled at the electrode (e.g. at a dielectric-covered electrode).

Conventional DC pulse implementations have various drawbacks. Difficulties arise due to the differences between the optimal parameter values (e.g., pulse length, pulse frequency, duty ratio) for a given process and the parameter values needed to maintain a plasma sheath. For instance, it may be undesirable to alter the DC pulse frequency and duty ratio for a given process even though charging might be reduced by doing so. Therefore, a plasma processing apparatus capable of reducing the rate of substrate charging without varying the DC pulse frequency or duty ratios may be desirable.

The RC electrical characteristic of the plasma processing chamber (i.e. as seen by a DC power supply) significantly impacts the charging and discharging of the substrate during the application of a DC bias voltage. Consequently, the period that a sheath voltage can be maintained is determined in large part by the RC time constant $\tau$ of the chamber. It is generally desirable to maintain a sheath voltage through as much of each DC pulse as possible. The DC voltage response at the substrate during application of DC pulse trains can be controlled for arbitrary pulse lengths, pulse frequencies, and duty ratios by controlling the RC time constant $\tau$.

The RC time constant $\tau$ can be tuned by altering the resistance and/or the capacitance of a DC current path between a DC power supply and a reference potential (e.g. a ground potential such as the grounded wall of a plasma processing chamber). Adjusting the capacitance may be accomplished by adding one or more capacitors between a DC coupling element (e.g. an electrostatic chuck) and the DC power supply. Additionally or alternatively, a capacitive pre-coat layer may be formed over the DC coupling element resulting in a large increase in capacitance. Similarly, the resistance can be adjusted by applying a resistive precoating to various inner surfaces of the plasma processing chamber or by adding resistors at various points along the DC current path.

A tuning circuit may be included between a DC pulse generator and the DC coupling element. The tuning circuit may include various capacitors such as fixed and variable capacitors. The capacitors may be arranged as banks of capacitors in parallel. Individual capacitors, banks of capacitors or other subsets of the capacitors may be selectable using one or more switches. A short circuit path between the DC pulse generator and the DC coupling element may also be included and selectable by the one or more switches.

The plasma processing apparatus and method of plasma processing described herein may advantageously give DC pulse train processes more margin and efficacy. For example, at low DC pulse frequencies, substrate charging may reduce or eliminate the desired effects of the DC pulse train. The apparatuses and methods described herein may advantageously decrease the effects of substrate charging at lower DC pulse frequencies.

The reduced substrate charging may in turn provide the benefit of allowing control over the IEDF. In particular, the ion energy spread may be reduced, average ion energy may be increased, and high energy ion flux at the substrate may be increased over conventional DC pulse train processes. Control over the energy distribution and the ion energy flux may be desirable in order to approach an ideal monoenergetic flux of appropriate magnitude for a given process.

Various embodiments described herein may advantageously allow an electrical characteristic of the plasma processing apparatus to be tuned to different DC pulse frequencies. For example, a tuning circuit including a variable capacitance may be utilized to select an appropriate capacitance (and/or resistance) in order to tune the electrical characteristic of a plasma processing chamber as seen by a bias power supply according to a desired DC pulse frequency.

Embodiments provided below describe various apparatuses and methods for plasma processing, and in particular, apparatuses and methods for plasma processing that include a tunable electrical characteristic. The following description describes the embodiments. An example schematic timing diagram of an embodiment plasma processing method is described using FIG. 1. Various qualitative graphs of voltage as a function of time and corresponding qualitative IEDF graphs corresponding to an embodiment plasma processing method at a given DC pulse frequency are described using FIG. 2. FIG. 3 is used to describe an embodiment plasma processing apparatus. Several other embodiment plasma processing apparatuses are described using FIGS. 4-6. An embodiment tuning circuit is described using FIG. 7. Three more embodiment tuning circuits are then described using FIGS. 8-10. Another embodiment plasma processing apparatus is described using FIG. 11. An embodiment method is described using FIG. 12.

FIG. 1 illustrates a schematic timing diagram of an example plasma processing method in accordance with an embodiment of the invention.

Referring to FIG. 1, a schematic timing diagram 100 illustrates the application of source power (SP) and bias power applied as DC voltage in a plasma processing apparatus. An SP pulse in and a DC pulse train 115 comprising a sequence of DC pulses 113. The SP pulse in and the DC pulse train 115 may be one cycle of a repeated process with SP pulse period $T_{SP}$. Each SP pulse in has an SP pulse duration $t_{SP}$ indicating the length of time that the source power is continuously applied in a given cycle. An SP duty ratio $D_{SP}$ can be defined as $t_{SP}/T_{SP}$. Similarly, each DC pulse has a DC pulse duration $t_{DC}$ and a DC pulse period $T_{DC}$ with a DC duty ratio $D_{DC}$ being defined as $t_{DC}/T_{DC}$ As illustrated, multiple DC pulses 113 (i.e. multiple periods $T_{DC}$) are applied in every SP pulse period $T_{SP}$. A DC duty ratio of 50% ($D_{DC}$=0.5) is shown, but both $D_{DC}$ and $D_{SP}$ may be any value between 0 and 1.

The source power may be alternating current (AC) power. For example, the source power may be radio frequency (RF) power with SP frequency $f_{SP}$. A delay $t_d$ may be included between the application of source power and the application of bias power in the form the DC pulse train 115. In some cases, a delay may also be included between the DC pulse train 115 and a subsequent SP pulse 111.

The DC pulse train 115 is applied at a DC pulse frequency $f_{DC}$ corresponding to the rate that successive DC pulses 113 are applied (i.e. $f_{DC}=1/T_{DC}$). The DC pulse frequency $f_{DC}$ is less than the SP frequency $f_{SP}$. In various embodiments, $f_{DC}$ is less than about 1000 kHz. In some embodiments, $f_{DC}$ is less than about 20 kHz and may be on the order of 1 kHz or lower. The DC pulse period $T_{DC}$ of $f_{DC}$ ($T_{DC}$=1 μs when $f_{DC}$=1000 kHz, $T_{DC}$=50 μs when $f_{DC}$=20 kHz, and so on).

Even at the higher DC pulse frequencies (e.g. above 100 kHz) the DC pulse train 115 differs from application of low frequency RF power because the bias power does not oscillate, but instead is removed for a fraction of each cycle equal to 1-$D_{DC}$. However, the various benefits of applying short DC pulse trains may be somewhat diminished as $f_{DC}$ is increased beyond woo kHz (e.g. due to rise and fall rate limitations).

The SP pulse period $T_{SP}$ is much longer than the DC pulse period $T_{DC}$. For example, the SP pulses 111 may be applied at a frequency between about 1 kHz and about 10 kHz in one embodiment although it can be much lower. This corresponds to $T_{SP}$ being between about 10 μs and about 1 ms. Consequently, $t_{SP}$ may range from about 5 μs to about 25 μs or longer.

It should be noted that that relative power levels of the source power and bias power are not indicated on the timing diagram 100. Similarly, the relative pulse lengths and the number of DC pulses in an SP period are also not represented by the timing diagram 100 in order to improve comprehension. That is, as implicitly indicated by the example frequencies and pulse lengths above, it is not uncommon for more than 50 DC pulses to occur in a given SP period.

Figure 2:
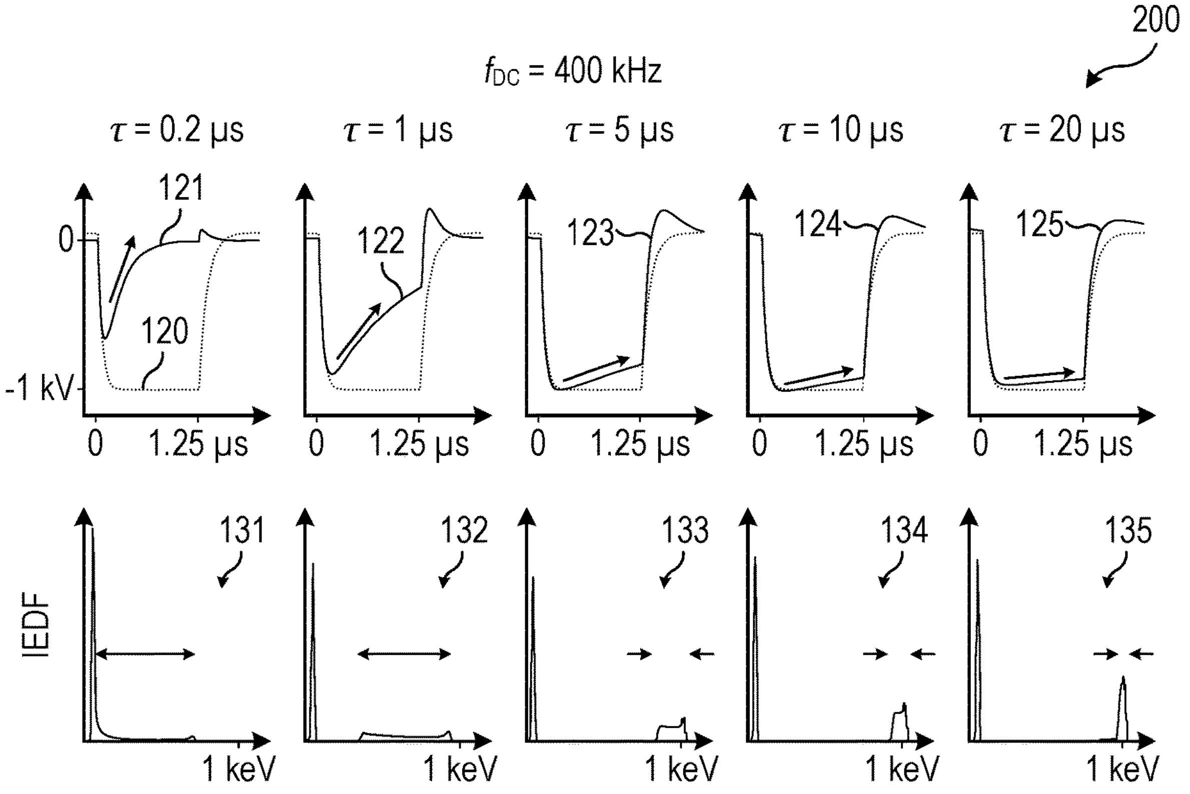
FIG. 2 illustrates qualitative graphs of voltage as a function of time and corresponding qualitative graphs of the ion energy distribution function for several RC time constants at a fixed DC pulse frequency in accordance with an embodiment of the invention.
Figure 3:
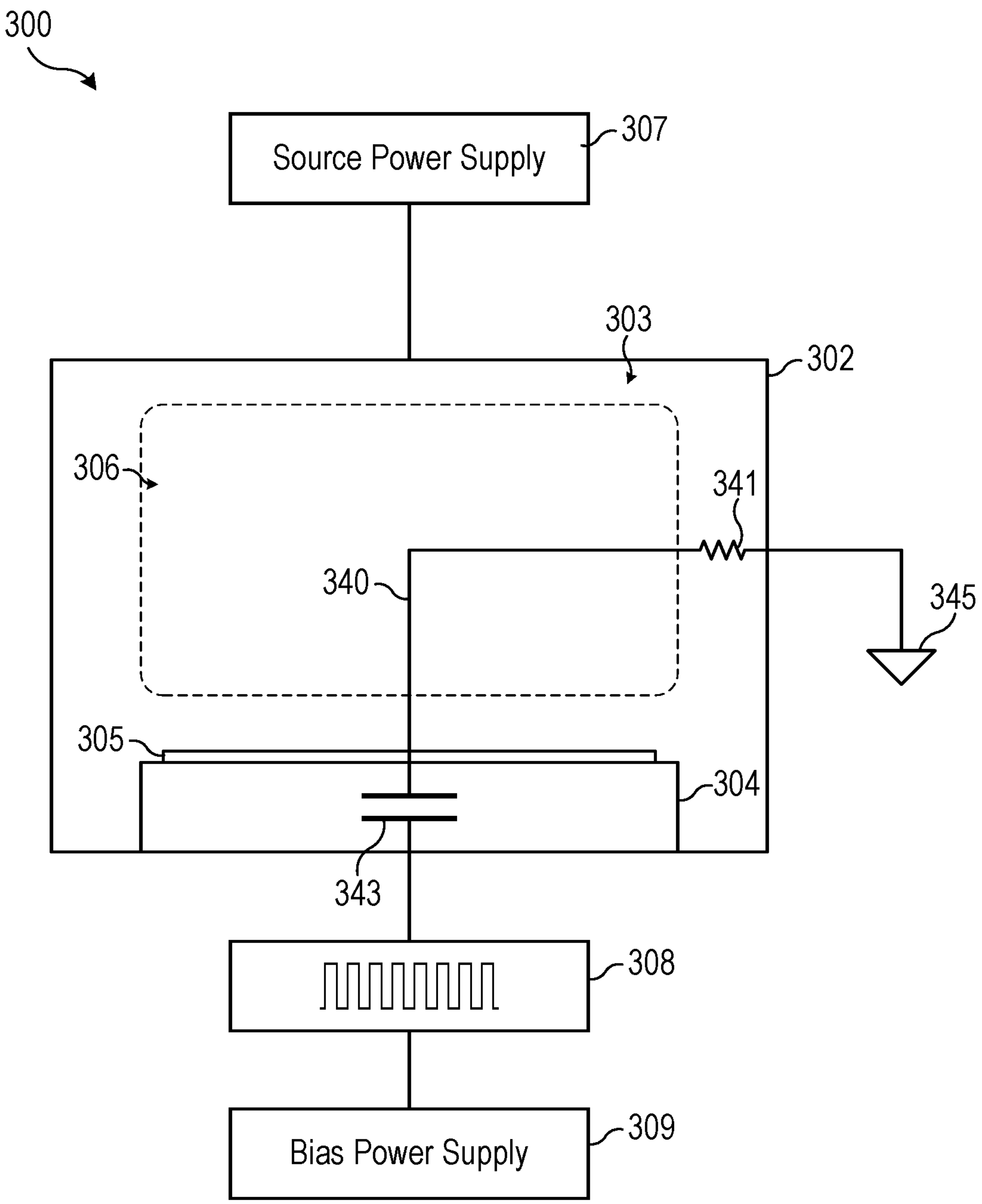
FIG. 3 illustrates a schematic diagram of an example plasma processing apparatus comprising a DC current path between a bias power supply and a reference potential node in accordance with an embodiment of the invention.

FIG. 2 illustrates qualitative graphs of voltage as a function of time and corresponding qualitative graphs of the ion energy distribution function for several RC time constants at a fixed DC pulse frequency in accordance with an embodiment of the invention.

Referring to FIG. 2, qualitative graphs 200 demonstrate the effects of varying the time constant τ while maintaining a DC pulse frequency $f_{DC}$ of 400 kHz and a 50% duty ratio ($D_{DC}$=0.5). Throughout the voltage graphs of the top row, the rod electrode response (e.g. of the DC coupling element) remains constant and is shown as dashed curve 120. As τ is increased from τ=0.2 μs to τ=20 μs, the voltage response at a substrate surface is shown as solid curves 121-125. The voltage at the substrate surface in this example is shown as negative, but it may also be positive depending on the configuration of the reference potential and the supplied bias power.

As shown by curve 121, at τ=0.2 μs the voltage at the substrate surface initially decreases with the rod electrode response, but then sharply increases due to charging before even reaching the minimum voltage of the rod electrode. This results in a steep return slope that diverges dramatically from the approximate square wave response of the rod electrode. At τ=1 μs (curve 122) the slope lessens, but the voltage still doesn't reach the minimum voltage of the rod electrode and voltage overshoot at the rising edge of the rod voltage becomes more pronounced. At τ=5 μs the slope of the bottom of the surface curve 123 is beginning to approach the flat square waveform of the rod voltage. The surface voltage reaches the minimum voltage and only increases about 15% over the 1.25 μs duration of the DC pulse.

As τ is increased to 10 μs and then further to 20 μs, the slope continues to flatten out, but with diminishing returns as the slope nearly mirrors the rod response. Consequently, the slope at the bottom of curve 124 is very similar to the slope at the bottom of curve 125. On the other hand, the voltage overshoot changes more dramatically from τ=10 μs to τ=20 μs as it begins to also approach the rod electrode response.

IEDF graphs 131-135 show the resulting IEDF at the substrate surface and correspond with curves 121-125 respectively. Due to the brief time that the surface spends at a negative voltage the IEDF for τ=0.2 μs shown in graph 131 has low energy (~700 eV) and a large spread (indicated by the double-sided arrows). Similarly, at τ=1 μs (graph 132) the ion energy is increased overall, but still only reaches about 950 eV with a ~500 eV spread. Lower ion energy can be disadvantageous since more voltage is needed to reach a desired ion energy. However, large energy spread can be even more undesirable as many of the ions reaching the substrate will not have the energy needed to produce the required effect. This may result in a drop in process efficiency and can render some processes impractical.

In contrast, graph 133 shows that the ion energy reaching 1 keV at τ=5 μs matches the applied voltage of −1 kV. Additionally, the flattening of the slope results in a much smaller energy spread of ~200 eV. Graphs 134 and 135 illustrate that as τ is increased to 10 μs and 10 μs the energy spread continues to decrease and the number of energetic ions increases.

The period $T_{DC}$ for $f_{DC}$=400 kHz is 2.5 μs. As can be seen from the above analysis, τ=5 μs provides various advantages in the surface voltage and the resulting IEDF. As 5 μs is double the period of 2.5 μs, a generally beneficial target for τ given $f_{DC}$ might be $\tau \geq 2/f_{DC}$. In words, the RC time constant is at least double the inverse of the DC pulse frequency. This target gives τ=2 μs for $f_{DC}$=1000 kHz and τ=100 μs for $f_{DC}$=20 kHz, as examples.

It should be noted, however, that this target may or may not accurately describe the desired $\tau$ depending on the specific details of a given application. For example, increasing $\tau$ at a given $f_{DC}$ continuously produces beneficial effects from the beginning, and not just upon reaching a particular target. Therefore, some applications may utilize a $\tau<2/f_{DC}$ (e.g. if $2/f_{DC}$ is impractical). Similarly, $\tau$ may often be in the vicinity of $2/f_{DC}$, but may also far exceed this value in applications where a near perfect square wave response at the substrate surface is desirable.

The duty ratio $D_{DC}$ may impact the target for $\tau$. For example, the IEDF spread may increase as $D_{DC}$ becomes larger (>0.5) and decrease as $D_{DC}$ becomes smaller (>0.5). Consequently, it may be desirable to have a higher $\tau$ for higher $D_{DC}$ and a lower $\tau$ for lower $D_{DC}$ compared to the target for $\tau$ at 50% duty ratio in a given plasma process.

FIG. 3 illustrates a schematic diagram of an example plasma processing apparatus comprising a DC current path between a bias power supply and a reference potential node in accordance with an embodiment of the invention. The plasma processing apparatus of FIG. 3 may be configured to perform plasma processing methods as described herein, such as according to the timing diagram of FIG. 1, for example.

Referring to FIG. 3, a plasma processing apparatus 300 includes a plasma processing chamber 302 coupled to a source power supply 307 and a bias power supply 309. The source power supply 307 is configured to generate plasma 306 in an interior 303 of the plasma processing chamber 302. The source power supply 307 may generate a capacitively coupled plasma (CCP) (as in FIG. 11 for example), an inductively coupled plasma (ICP), a surface wave plasma (SWP), and others. For example, the source power may be coupled to a helical resonator antenna that generates plasma 306 in the plasma processing chamber 302.

In this schematic example, the source power supply 307 is coupled to the top of the plasma processing chamber 302 and the bias power supply 309 is coupled to a substrate holder 304 in the interior 303 of the plasma processing chamber 302, but other configurations are also possible. The substrate holder 304 is configured to support a substrate 305. For example, the substrate holder 304 may be an electrostatic chuck (ESC). Alternatively, the substrate holder may be a vacuum chuck or other suitable support structure.

A DC pulse generator 308 is coupled between the bias power supply 309 and the substrate holder 304. The DC pulse generator 308 is configured to generate a DC pulse train at a DC pulse frequency. For example, the DC pulse generator 308 in combination with the bias power supply 309 may be configured to apply a DC pulse train to the substrate holder as shown in the timing diagram 100 of FIG. 1.

A reference potential node 345 is coupled to the plasma processing chamber 302. In one embodiment, the reference potential node 345 is coupled to a wall of the plasma processing chamber 302 as shown. The reference potential node 345 is a ground connection in one embodiment. The reference potential node 345 creates a DC current path 340 between the bias power supply 309 and the reference potential node 345. The behavior of the DC current path 340 may be modeled as including a resistive component 341 and a capacitive component 343.

The plasma 306 itself supplies a conductive portion of the DC current path 340. If should be noted that extent of the dashed boundary of plasma 306 is drawn as stopping short of the walls of the plasma processing chamber 302 and the substrate holder 304/substrate 305 for readability purposes only. That is, in reality the plasma 306 extends to and interfaces with the walls of the plasma processing chamber 302, the substrate holder 304, and the substrate 305.

Further, it should be recognized that this simplified model is conceptual. The actual current paths that contribute to the resistive component 341 and capacitive component 343 may be much more complicated than depicted. That is, plasma current may travel along all surfaces of the chamber. The chamber surfaces may have inductive, resistive, and capacitive components that contribute to the overall behavior of the circuit. Many other contributory sources of the resistive component 341 and capacitive component 343 may also be present (many of which will be discussed in the following).

The resistive component 341 and the capacitive component 343 of the DC current path 340 contribute to the electrical characteristics of the plasma processing chamber 302 as seen by the bias power supply 309. In this simplified model, the DC current path 340 is a series RC circuit with a time constant $\tau$ equal to RC where R is the resistance of the resistive component 341 and Cis the capacitance of the capacitive component 343. As previously described in reference to FIG. 2, tuning the time constant $\tau$ may improve the voltage response at the substrate 305 and advantageously result in less ion energy spread, higher ion energy, and increased ion flux at the substrate 305.

Of course, several physical components may contribute to one or both of the resistive component 341 and the capacitive component 343. As will be apparent from the subsequent description, although the locations of the resistive component 341 and the capacitive component 343 may represent the positions of some corresponding physical components, the specific locations are also variable within the plasma processing apparatus.

Figure 4:
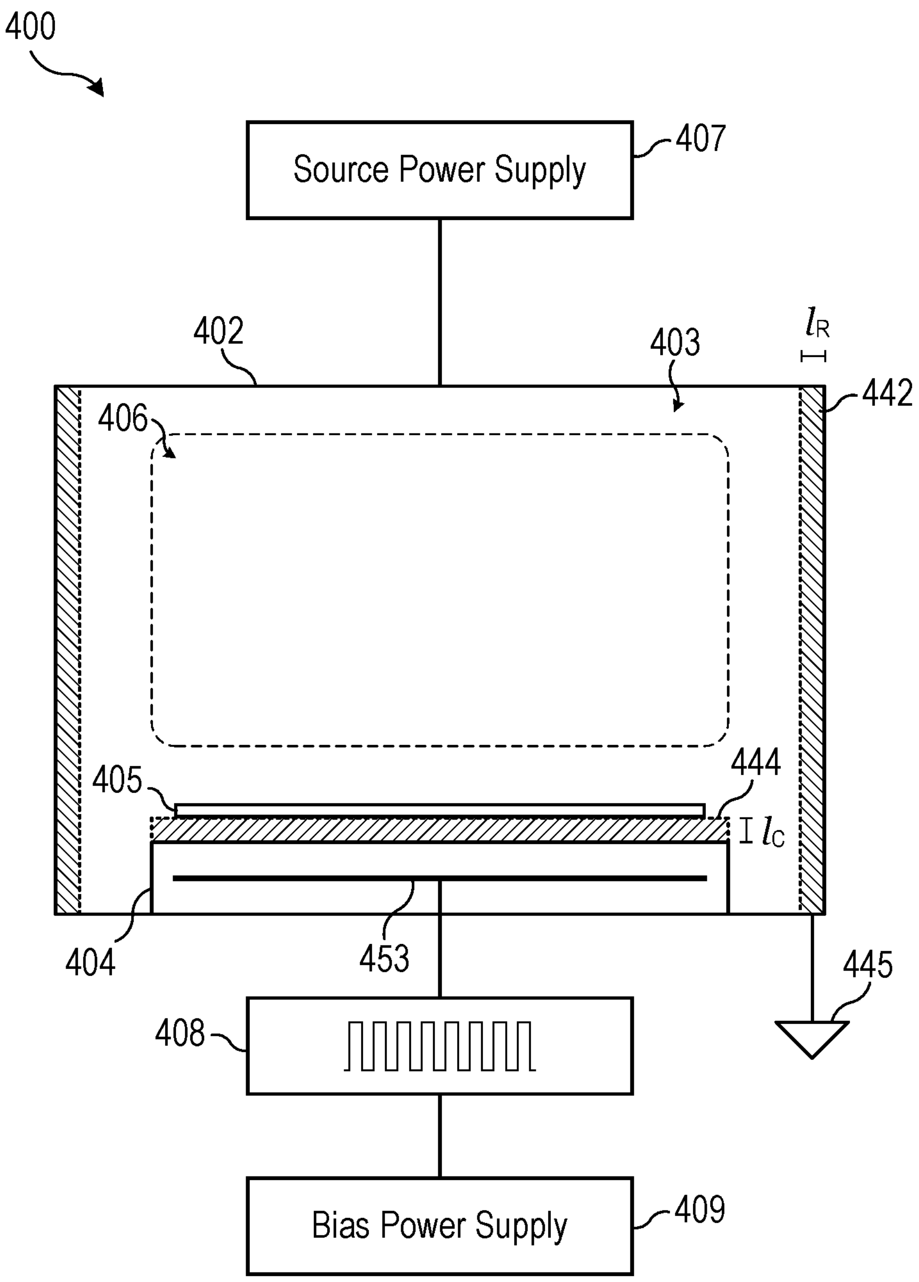
FIG. 4 illustrates a schematic diagram of an example plasma processing apparatus comprising an optional capacitive pre-coat layer and an optional resistive pre-coat layer in accordance with an embodiment of the invention.

FIG. 4 illustrates a schematic diagram of an example plasma processing apparatus comprising an optional capacitive pre-coat layer and an optional resistive pre-coat layer in accordance with an embodiment of the invention. The plasma processing apparatus of FIG. 4 may be a specific implementation of other plasma processing apparatuses described herein such as the plasma processing apparatus of FIG. 3, for example. Similarly labeled elements may be as previously described.

Referring to FIG. 4, a plasma processing apparatus 400 includes a substrate holder 404 disposed in an interior 403 of a plasma processing chamber 402 coupled to a source power supply 407 configured to generate plasma 406. A bias power supply 409 is coupled to a DC pulse generator 408 which is in turn coupled to a DC coupling element 453 disposed in the substrate holder 404.

It should be noted that here and in the following a convention has been adopted for brevity and clarity wherein elements adhering to the pattern [x10] may be related implementations of a plasma processing chamber in various embodiments. For example, the plasma processing chamber 402 may be similar to the plasma processing chamber 302 except as otherwise stated. An analogous convention has also been adopted for other elements as made clear by the use of similar terms in conjunction with the aforementioned three-digit numbering system.

A reference potential node 445 is coupled to a wall of the plasma processing chamber 402. A DC current path is created from the bias power supply 409, through the DC coupling element 453 and the plasma 406, and to the reference potential node 445.

The substrate holder 404 is configured to support a substrate 405. A capacitive pre-coat layer 444 may be disposed on an upper surface of the substrate holder 404 between the substrate holder 404 and the substrate 405. However, other configurations are possible. In some embodiments, the capacitive pre-coat layer 444 may also be omitted (e.g. in favor of alternatives or in implementations that only utilize additional resistive components).

The capacitive pre-coat layer 444 increases the capacitance of the DC current path (functioning as a capacitive component). For example, the capacitance of the capacitive pre-coat layer 444 may be written as $C=\varepsilon A_C/l_C$ where $\varepsilon$ is the permittivity, $A_C$ is the area, and $l_C$ is the thickness of the capacitive pre-coat layer 444. While many configurations are possible and will depend on the specifics of a given application, one example set of values may be $\varepsilon=6$ nF/m, $A_C=(100\text{ mm})^2$, and $l_C=600$ μm which yields a capacitance C of 100 nF.

For a given substrate size (e.g. wafer size), A may remain constant while the permittivity e (i.e. relative permittivity/dielectric constant) and the thickness $l_C$ may be varied to achieve the desired capacitance C. For applications involving substrates of different sizes (e.g. larger wafers), A may impact the choice of $\varepsilon$ and $l_C$ by increasing the capacitance. In some cases higher or lower dielectric constant materials may be needed to ensure appropriate capacitive pre-coat layer thicknesses.

The capacitive pre-coat layer 444 comprises a dielectric material in various embodiments and is a ceramic material in some embodiments. The capacitive pre-coat layer 444 may comprise silicon, and comprises silica ($SiO_2$) in one embodiment. In another embodiment, the capacitive pre-coat layer 444 comprises yttria ($Y_2O_3$).

However, a variety of dielectric materials may be suitable for use as the capacitive pre-coat layer 444. As the aforementioned equation indicates, utilizing a material with a higher or lower dielectric constant simply requires increasing or decreasing the thickness $l_C$ accordingly. Other consideration such as process compatibility, potential dielectric breakdown, and other material properties may also be taken into consideration.

It is recognized that the dielectric constant of a given material depends on a variety of factors. For example, a person skilled in the art would recognize that the dielectric constant is frequency-dependent. In the context of this disclosure, the dielectric constant (and by extension the permittivity) in the capacitance equation is assumed to be considered under the application frequency operating conditions (e.g. DC pulse frequency). It is assumed, in view of the description herein, that a person skilled in the art would be capable of making appropriate adjustments to the thickness of the capacitive pre-coat layer based on the various specifics of a given application.

A resistive pre-coat layer 442 of thickness $l_R$ may be included on surfaces of the interior 403 of the plasma processing chamber 402. Although here the resistive pre-coat layer 442 is included on surfaces of the plasma processing chamber 402, other configurations are also possible (e.g. depending on the location and configuration of the reference potential node 445). In some embodiments, the resistive pre-coat layer 442 may be omitted (e.g. in favor of alternatives or in implementations that only utilize additional capacitive components).

Similar to the capacitive pre-coat layer 444 discussed above, the resistive properties of the resistive pre-coat layer 442 increases the resistance of the DC current path (functioning as a resistive component). The geometry of the plasma processing chamber 402 impacts the resistance R of the resistive pre-coat layer 442. For example, the resistance $R=\rho l/A_R$ where $\rho$ is the resistivity, $A_R$ is the cross-sectional area perpendicular to the direction of DC current flow, and l is the length of the resistive pre-coat layer 442 in the direction of the DC current flow. Although the resistive pre-coat layer 442 is only shown covering the vertical sides of the plasma processing chamber 402 it should be understood that other surfaces such as top surfaces of the plasma processing chamber 402 or side surfaces of the substrate holder 404 may also be covered.

Assuming that the current travels along the surfaces of the plasma processing chamber 402, $A_R$ may be approximated as $2\pi r\times l_R$ where r is the radius of the plasma processing chamber 402 (for a cylindrical chamber, but any suitable chamber shape may be used). The length 1 is then the average distance that the current must travel to reach the reference potential node. As one might expect, many configurations are possible and will depend on a variety of specific factors for a given application. One example set of values may be $\rho=10^{-}\Omega\cdot m$, $A_R=2\pi(0.15\text{ m})(100\text{ nm})\approx10^{-7}\text{ m}^2$, and $l=0.1$ m which yields a resistance R of about 1 kΩ.

Using the capacitive pre-coat layer 444 and the resistive pre-coat layer 442 values of $\tau$ that significantly improve voltage response at the surface of the substrate 405 may advantageously be attainable for a wide range of frequencies. For example, for C=100 nF and R=1 kΩ, $\tau=100$ μs (=2/20 kHz). Doubling C and R results in $\tau=400$ μs corresponding to $f_{DC}=5$ kHz. Although certain practical limitations may exist regarding the maximum values of C and R, the effects of charging may be reduced over a large portion of the duration of each DC pulse at advantageously low DC pulse frequencies $f_{DC}$.

The resistive pre-coat layer 442 comprises a resistive material in various embodiments. In one embodiment, the resistive pre-coat layer 442 comprises amorphous carbon (aC). In another embodiment, the resistive pre-coat layer 442 comprises graphitic carbon. The resistive pre-coat layer 442 may also comprise graphitic carbon-based materials. Additionally, the resistive pre-coat layer 442 may also comprise a silicon-like material, or a silica-like material, as well as others. Since the resistive pre-coat layer 442 is exposed to the plasma 406 and the substrate 405, the choice of material may be impacted by process compatibility. For example, carbon-based resistive pre-coat layers may be compatible with Si and $SiO_2$ etching processes.

Figure 5:
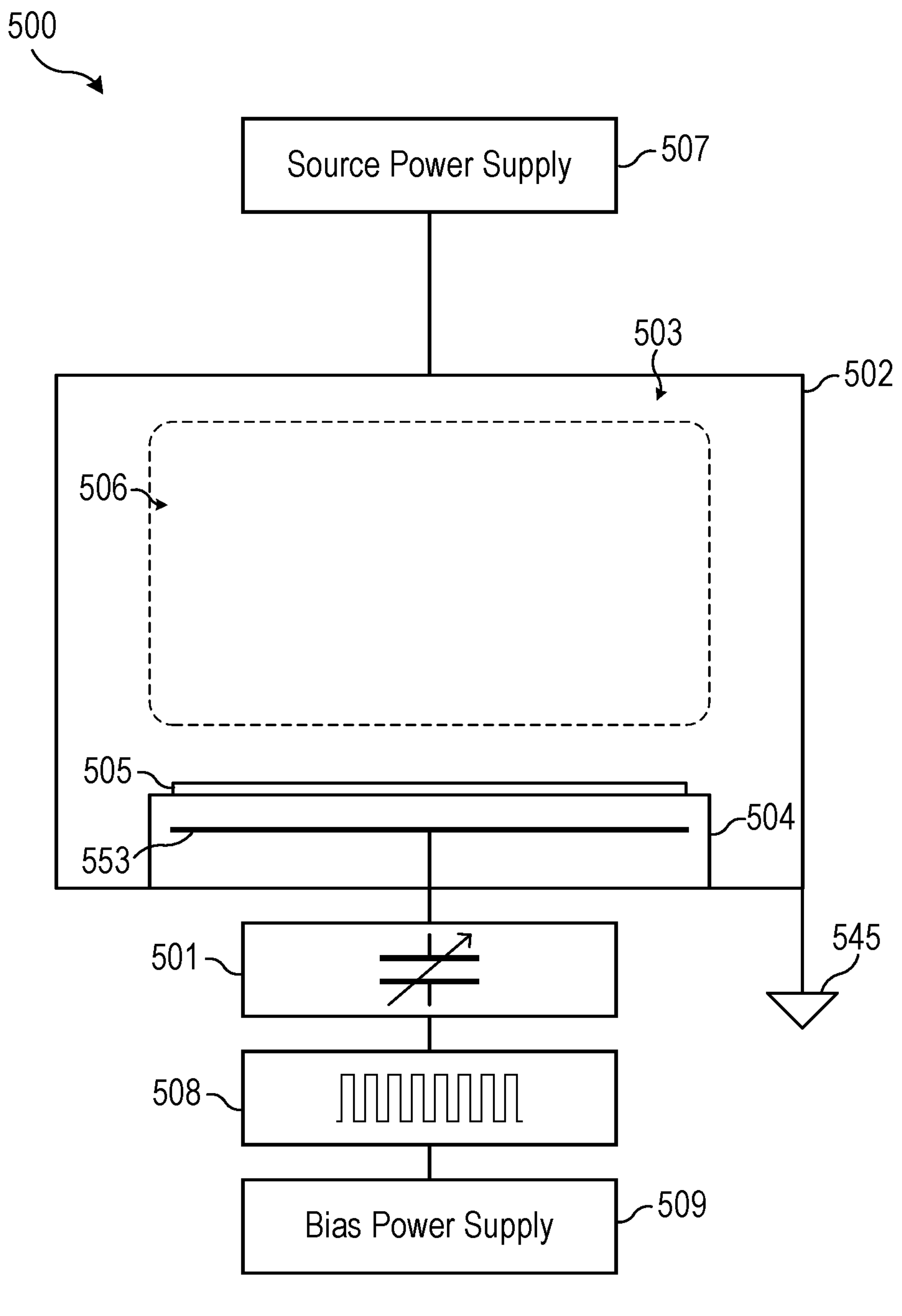
FIG. 5 illustrates a schematic diagram of an example plasma processing apparatus comprising a tuning circuit with a variable capacitance in accordance with an embodiment of the invention.

FIG. 5 illustrates a schematic diagram of an example plasma processing apparatus comprising a tuning circuit with a variable capacitance in accordance with an embodiment of the invention. The plasma processing apparatus of FIG. 5 may be a specific implementation of other plasma processing apparatuses described herein such as the plasma processing apparatus of FIG. 3, for example. Similarly labeled elements may be as previously described.

Referring to FIG. 5, a plasma processing apparatus 500 includes a substrate holder 504 configured to support a substrate 505 and disposed in an interior 503 of a plasma processing chamber 502 coupled to a source power supply 507 that is configured to generate plasma 506. A tuning circuit 501 is coupled between a DC pulse generator 508 and a DC coupling element 553 disposed in the substrate holder 504. A bias power supply 509 is coupled to the DC pulse generator 508. A reference potential node 545 is coupled to the plasma processing chamber 502.

The tuning circuit 501 has a variable capacitance. That is, the capacitance of the tuning circuit 501 may be varied in order to tune an electrical characteristic if the plasma processing chamber 502. In one embodiment, the electrical characteristic is the time constant T of a DC current path between the bias power supply 509 and the reference potential node 545. The capacitance of the tuning circuit 501 may be tuned manually or automatically, and during or in between operation of the plasma processing apparatus 500. The capacitance of the tuning circuit 501 may be selected mechanically, electronically, electromechanically, or with any other suitable selection mechanism.

The tuning circuit 501 may also include static or variable resistive components. In some cases it may be desirable to incorporate such additional resistive components between the substrate 505 and the reference potential node 545 rather than between the substrate 505 and the bias power supply 509 in order to prevent an unnecessary voltage drop between the substrate 505 and the bias power supply 509.

Figure 6:
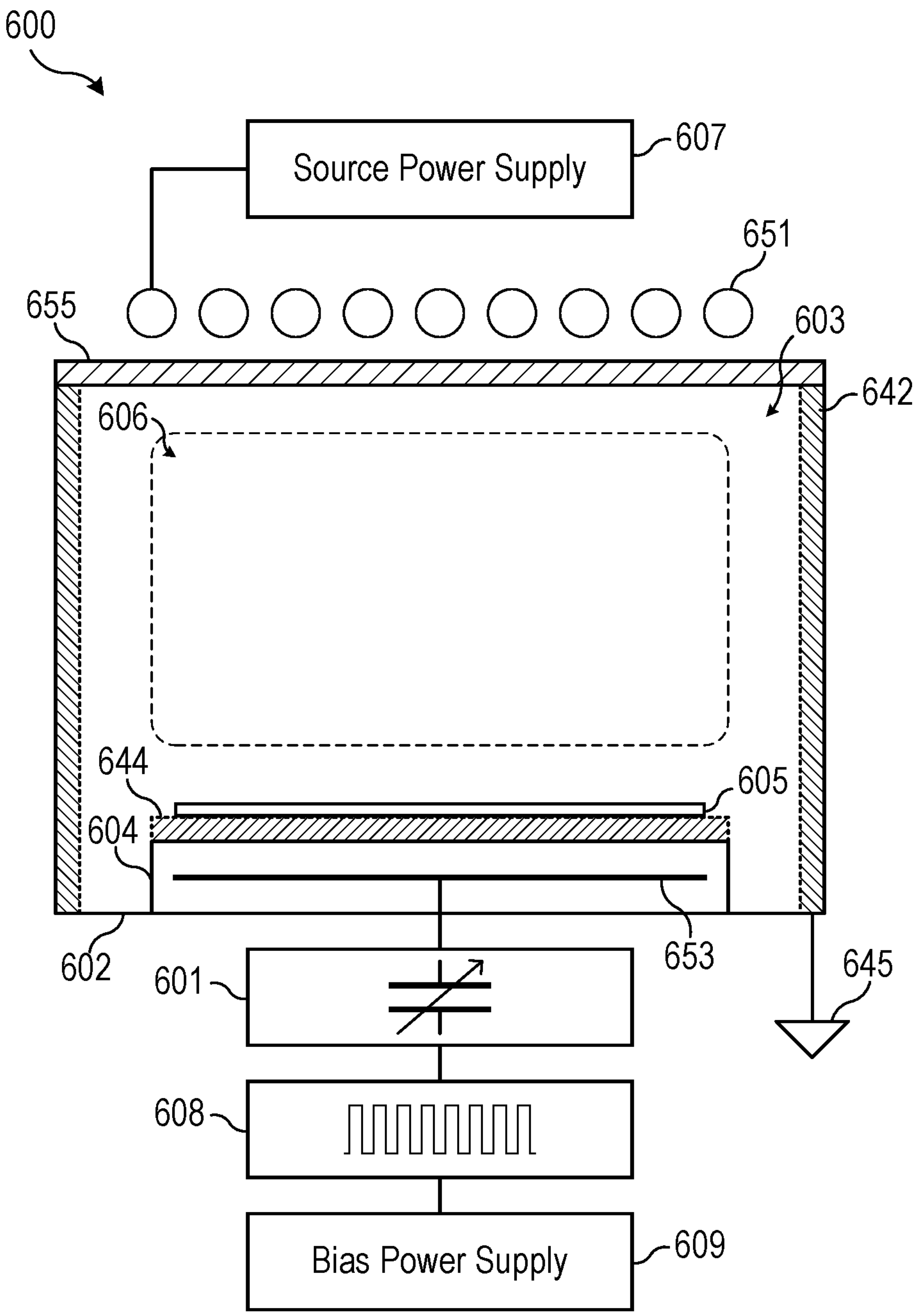
FIG. 6 illustrates a schematic diagram of an example plasma processing apparatus comprising a tuning circuit along with an optional capacitive pre-coat layer and an optional resistive pre-coat layer in accordance with an embodiment of the invention.

FIG. 6 illustrates a schematic diagram of an example plasma processing apparatus comprising a tuning circuit along with an optional capacitive pre-coat layer and an optional resistive pre-coat layer in accordance with an embodiment of the invention. The plasma processing apparatus of FIG. 6 may be a specific implementation of other plasma processing apparatuses described herein such as the plasma processing apparatus of FIG. 3, for example. Similarly labeled elements may be as previously described.

Referring to FIG. 6, a plasma processing apparatus 600 includes a substrate holder 604 configured to support a substrate 605 and disposed in an interior 603 of a plasma processing chamber 602. A tuning circuit 601 is coupled between a DC pulse generator 608 and a DC coupling element 653 disposed in the substrate holder 604. A bias power supply 609 is coupled to the DC pulse generator 608. A reference potential node 645 is coupled to the plasma processing chamber 602.

A source power supply 607 that is configured to generate plasma 506 is coupled to a source power coupling element 651. In one embodiment, the source power coupling element 651 is an inductive coupling element that couples source power to the plasma processing chamber 602 through an insulator 655 (as shown), but other configurations are possible.

A capacitive pre-coat layer 644 may be disposed on an upper surface of the substrate holder 604 between the substrate holder 604 and the substrate 605. A resistive pre-coat layer 642 may be included on surfaces of the interior 603 of the plasma processing chamber 602. In some embodiments, the capacitive pre-coat layer 644 or the resistive pre-coat layer 642 may be omitted.

In embodiments where both the tuning circuit 601 and the capacitive pre-coat layer 644 are included, the total capacitance C of the DC current path between the bias power supply 609 and the reference potential node 645 is a combination of both capacitive components. Since the tuning circuit 601 is in series with the capacitive pre-coat layer 644, $C=(1/C_{fixed}+1/C_{tuning})^{-1}$.

Due to the form of the series capacitor equation, C will always be less than $C_{fixed}$ and will approach $C_{fixed}$ as $C_{tuning}$ becomes very large. In some cases, the tuning circuit 601 may include a short circuit option that does not add capacitance allowing C to equal $C_{fixed}$ when selected. Since even values of $C_{tuning}$ far exceeding $C_{fixed}$ (e.g. 10 times) still only result in C being 91% of $C_{fixed}$, if a C equal to $C_{fixed}$ is desired, the tuning circuit 601 may be bypassed using the short circuit option.

Figure 7:
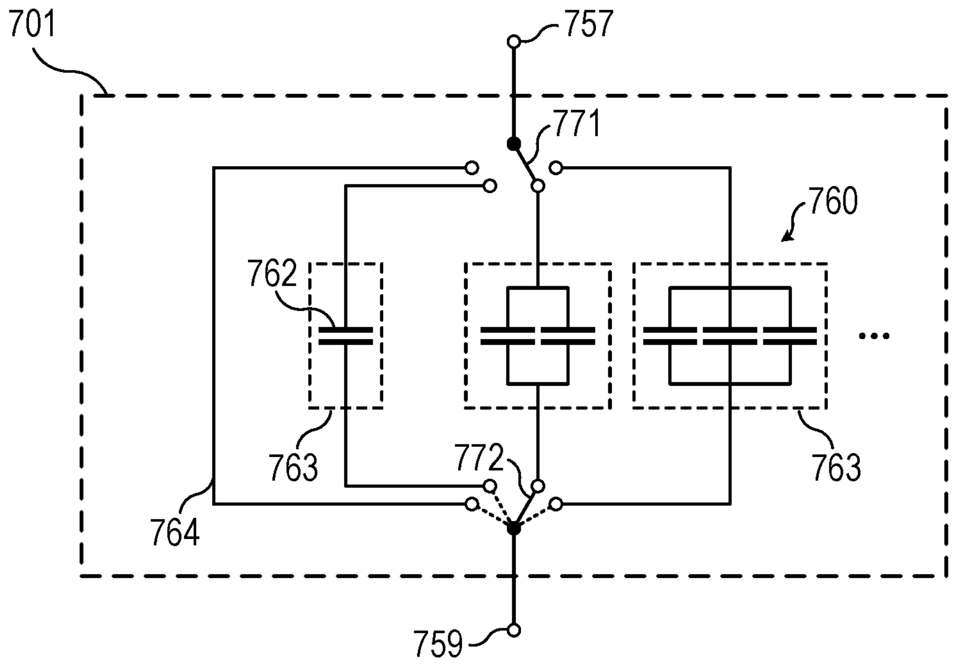
FIG. 7 illustrates a schematic diagram of an example tuning circuit comprising a single pole switch and a plurality of capacitors in accordance with an embodiment of the invention.

FIG. 7 illustrates a schematic diagram of an example tuning circuit comprising a single pole switch and a plurality of capacitors in accordance with an embodiment of the invention. The tuning circuit of FIG. 7 may be a specific implementation of other tuning circuits described herein such as the tuning circuits of FIGS. 5 and 6, for example. Similarly labeled elements may be as previously described.

Referring to FIG. 7, a tuning circuit 701 includes a first tuning input/output 757 (e.g. for coupling to a DC coupling element) and a second tuning input/output 759 (e.g. for coupling to a DC pulse generator). The tuning circuit 701 further includes a plurality of capacitors 760 which may include fixed capacitors 762 as shown. In various embodiments, the fixed capacitors 762 are high reliability capacitors. In some embodiments, some or all of the fixed capacitors 762 are vacuum capacitors. In some embodiments, some or all of the fixed capacitors 762 are ceramic capacitors.

A first single pole switch 771 includes a single pole (input) coupled to the first tuning input/output 757 and at least one throw (output) coupled to a subset of the plurality of capacitors 760. An optional second single pole switch 772 may be coupled between the subset of the plurality of capacitors 760 and the second tuning input/output 759 (e.g. to further isolate the current paths that are not selected from the selected current path). The locations of the first single pole switch 771 and the optional second single pole switch 772 may be switched. Optionally, a short circuit path 764 is also included between the first tuning input/output 757 and the second tuning input/output 759.

The first single pole switch 771 (and the optional second single pole switch 772) is a mechanical switch in some embodiments. In one embodiment, the mechanical switch is an electromechanical switch. In other embodiments, other suitable switches may be used such as electrical switches. However, it should be noted that care should be taken to avoid parasitics and dielectric breakdown due to application of high voltage.

In one embodiment, the first single pole switch 771 is a single pole multiple throw switch (as illustrated) including multiple outputs coupled to multiple subsets of the plurality of capacitors 760. In another embodiment, the first single pole switch 771 is a single pole single throw switch and the tuning circuit 701 includes additional single pole single throw switches coupled to the plurality of capacitors. Other combinations of single pole switches are of course possible.

The plurality of capacitors 760 may be arranged as banks of capacitors 763. In one embodiment, the banks of capacitors 763 are physical groupings of separate capacitors. One (or two if the optional switch is included) single pole multiple throw switch may be utilized to select between banks of capacitors completely isolated from one another. In another embodiment, the banks of capacitors 763 are logical groupings (e.g. some or all of the capacitors are used in more than one logical bank).

The subsets of the plurality of capacitors 760 may be mutually exclusive. However, using the same capacitors in more than one subset may reduce the number of capacitors needed to achieve a given variable capacitance range, but may also increase the complexity of the tuning circuit or allow parasitic currents within the tuning circuit. In one specific example, the first single pole switch 771 is a rotary switch with outputs coupled to n fixed capacitors 762. The rotary switch has n+1 positions that include a position for coupling each number of capacitors from 1 to n and a position coupling zero coupled capacitors (short circuit path 764). A variation omits the short circuit path 764 and includes only n positions.

In another specific example, the capacitors are arranged in n banks of capacitors that each include $2^m$ capacitors where m ranges from 0 to n−1. A number n of single pole single throw switches may then be used to select a combination of banks resulting in 1 to n−1 coupled capacitors. If the short circuit path 764 is included, an additional single pole single throw switch may allow selection of the short circuit path 764.

In effect, selected subsets of the plurality of capacitors 760 form the capacitance $C_{tuning}$ discussed previously. Since there is no requirement for the constituent capacitors of the plurality of capacitors to be identical, $C_{tuning}$ can be tailored as needed for a given application. However, the simple example of n identical fixed capacitors 762 each with capacitance $C_0$ is useful for illustrating the functionality of the tuning circuit 701. Then a $C_{tuning}=nC_0$. In the absence of other capacitive components the variable capacitance of the tuning circuit 701 would range from 0 to $nC_0$ in discrete $C_0$ steps.

However, if another capacitive component is also included in series (e.g. a capacitive pre-coat layer) then the total capacitance $C_n=(1/C_{fixed}+1/nC_0)^{-1}$. Although n cannot be zero in this equation, it is noted that the n=0 case (where a short circuit path is selected) would make $C=C_{fixed}$ as previously discussed. In the specific example where $C_{fixed}=100$ nF and $C_0=5$ nF, $C_{n=1,2,3\ldots}=\{4.8$ nF, 9.1 nF, 13 nF, . . . $\}$. Of course, fixed capacitors are available with capacitance values both lower and higher than 5 nF.

The increase in total capacitance for each added capacitor decreases as n increases. For example, $C_{20}=50$ nF, but $C_{30}=60$ nF. Notably, in the absence of $C_{fixed}$, $C_{20}=100$ nF and $C_{30}=150$ nF. Therefore, the combination of a capacitive pre-coat layer and a tuning circuit may be desirable when a high maximum capacitance is desirable (e.g. 100 nF), but there is not sufficient space for a large number capacitors in a tuning circuit. The relatively small number of capacitors in the tuning circuit would then permit granular capacitance selection in the lower range such as about 5 nF (n=1) to about 33 nF (n=10), for example.

Figure 8:
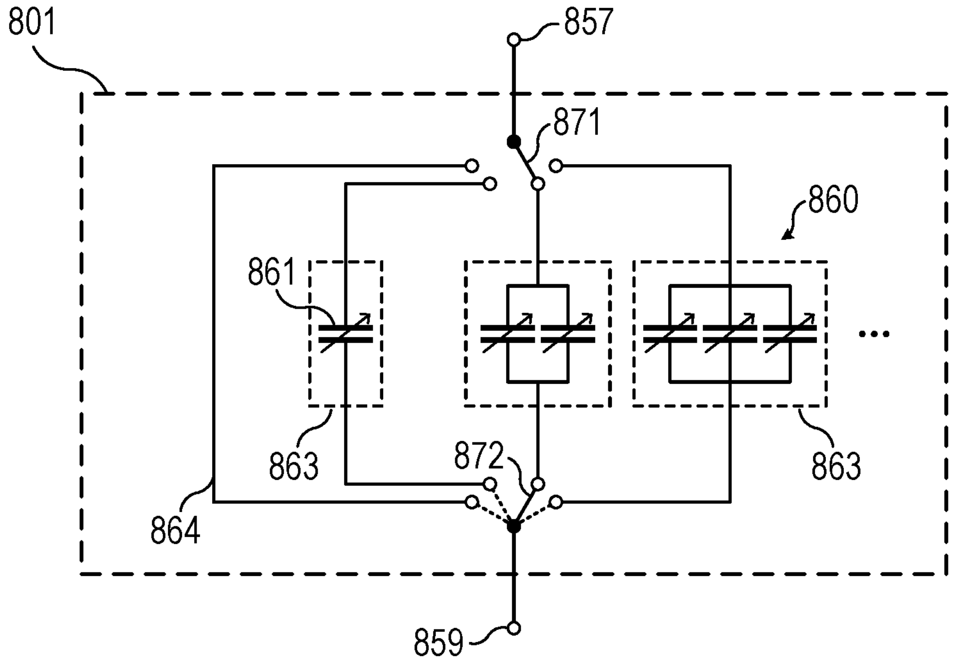
FIG. 8 illustrates a schematic diagram of an example tuning circuit comprising a single pole switch and a plurality of variable capacitors in accordance with an embodiment of the invention.

FIG. 8 illustrates a schematic diagram of an example tuning circuit comprising a single pole switch and a plurality of variable capacitors in accordance with an embodiment of the invention. The tuning circuit of FIG. 8 may be a specific implementation of other tuning circuits described herein such as the tuning circuit of FIG. 7, for example. Similarly labeled elements may be as previously described.

Referring to FIG. 8, a tuning circuit 801 includes a first tuning input/output 857, a second tuning input/output 859, and a plurality of capacitors 860 which may include variable capacitors 861 arranged in banks of capacitors 863 as shown. In various embodiments, the variable capacitors 861 are high reliability capacitors. In some embodiments, some or all of the variable capacitors 861 are vacuum capacitors. In some embodiments, some or all of the variable capacitors 861 are ceramic capacitors. The tuning circuit 801 further includes a first single pole switch 871 and may also include an optional second single pole switch 872. An optional short circuit path 864 may also be included.

The tuning circuit 801 differs from the tuning circuit 701 in that variable capacitors 861 are utilized rather than fixed capacitors. This may have the additional advantage of allowing smooth capacitance transitions over the available range of the variable capacitance. However, the variable capacitors may have lower capacitance than fixed capacitors and may also be larger and more expensive.

Figure 9:
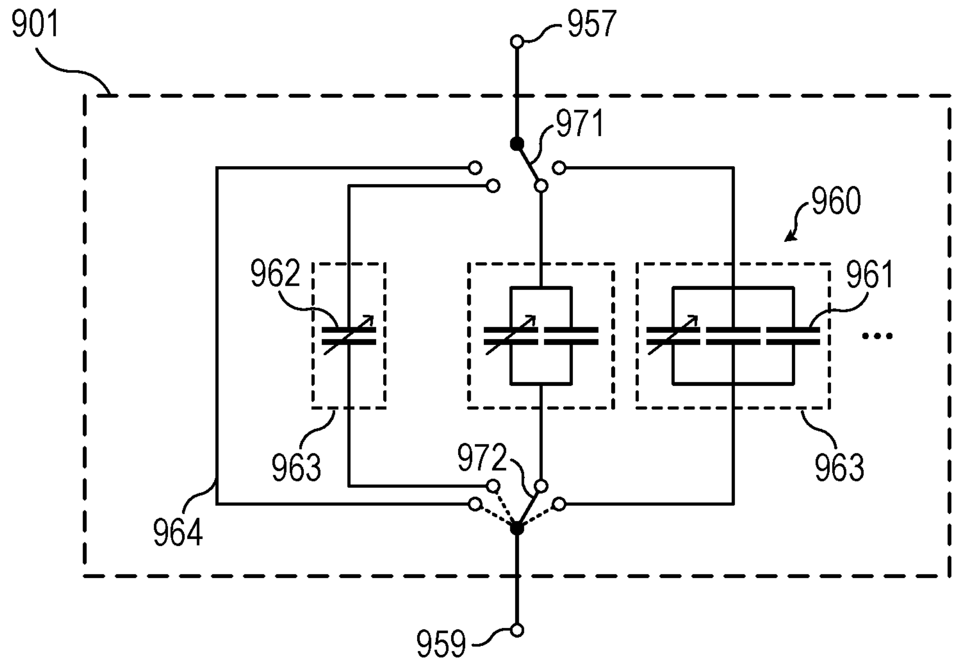
FIG. 9 illustrates a schematic diagram of an example tuning circuit comprising a single pole switch and a plurality of capacitors including fixed capacitors and variable capacitors in accordance with an embodiment of the invention.

FIG. 9 illustrates a schematic diagram of an example tuning circuit comprising a single pole switch and a plurality of capacitors including fixed capacitors and variable capacitors in accordance with an embodiment of the invention. The tuning circuit of FIG. 9 may be a specific implementation of other tuning circuits described herein such as the tuning circuit of FIG. 7, for example. Similarly labeled elements may be as previously described.

Referring to FIG. 9, a tuning circuit 901 includes a first tuning input/output 957, a second tuning input/output 959, and a plurality of capacitors 960 which may include variable capacitors 961 as well as fixed capacitors 962 arranged in banks of capacitors 963 as shown. The tuning circuit 901 further includes a first single pole switch 971 and may also include an optional second single pole switch 972. An optional short circuit path 964 may also be included.

The tuning circuit 901 differs from the tuning circuit 701 and the tuning circuit 801 in that both variable capacitors 961 and fixed capacitors 962 are utilized. This may beneficially allow expanded range of the variable capacitance while also improving the fine control of the capacitance.

Figure 10:
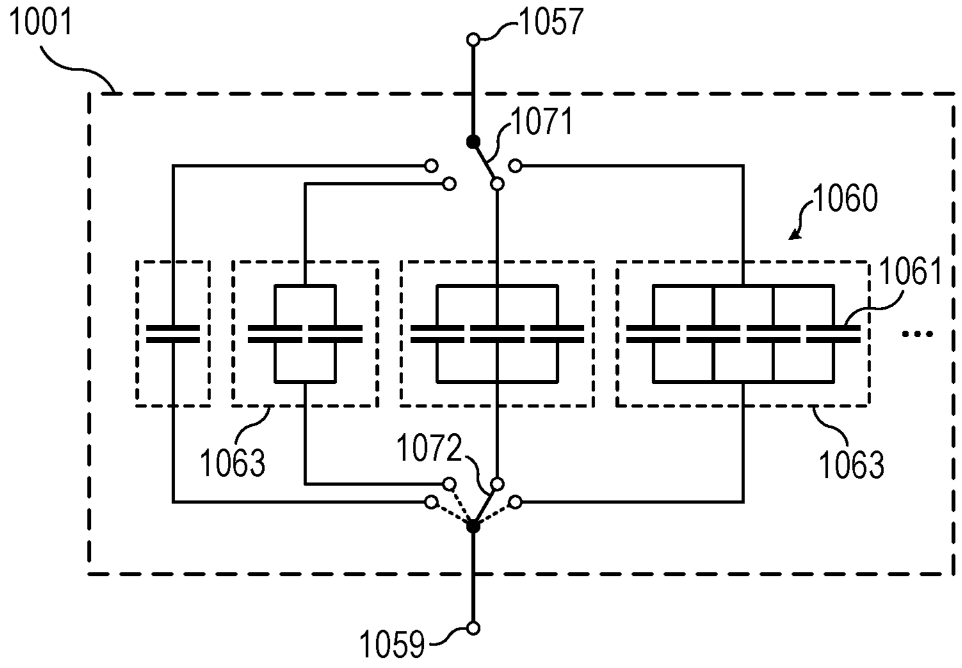
FIG. 10 illustrates a schematic diagram of an example tuning circuit comprising a single pole switch and a plurality of capacitors in accordance with an embodiment of the invention.

FIG. 10 illustrates a schematic diagram of an example tuning circuit comprising a single pole switch and a plurality of capacitors in accordance with an embodiment of the invention. The tuning circuit of FIG. 10 may be a specific implementation of other tuning circuits described herein such as the tuning circuit of FIG. 7, for example. Similarly labeled elements may be as previously described.

Referring to FIG. 10, a tuning circuit 1001 includes a first tuning input/output 1057, a second tuning input/output 1059, and a plurality of capacitors 1060 which may include fixed capacitors 1062 arranged in banks of capacitors 1063 as shown. The tuning circuit 1001 further includes a first single pole switch 1071 and may also include an optional second single pole switch 1072.

The tuning circuit 1001 is a specific implementation of the tuning circuit 701 where a short circuit path is omitted. This configuration may be useful, for example, when the capacitive pre-coat layer is omitted. As previously discussed, variable capacitors may also be utilized instead of or in addition to the fixed capacitors 1062.

Figure 11:
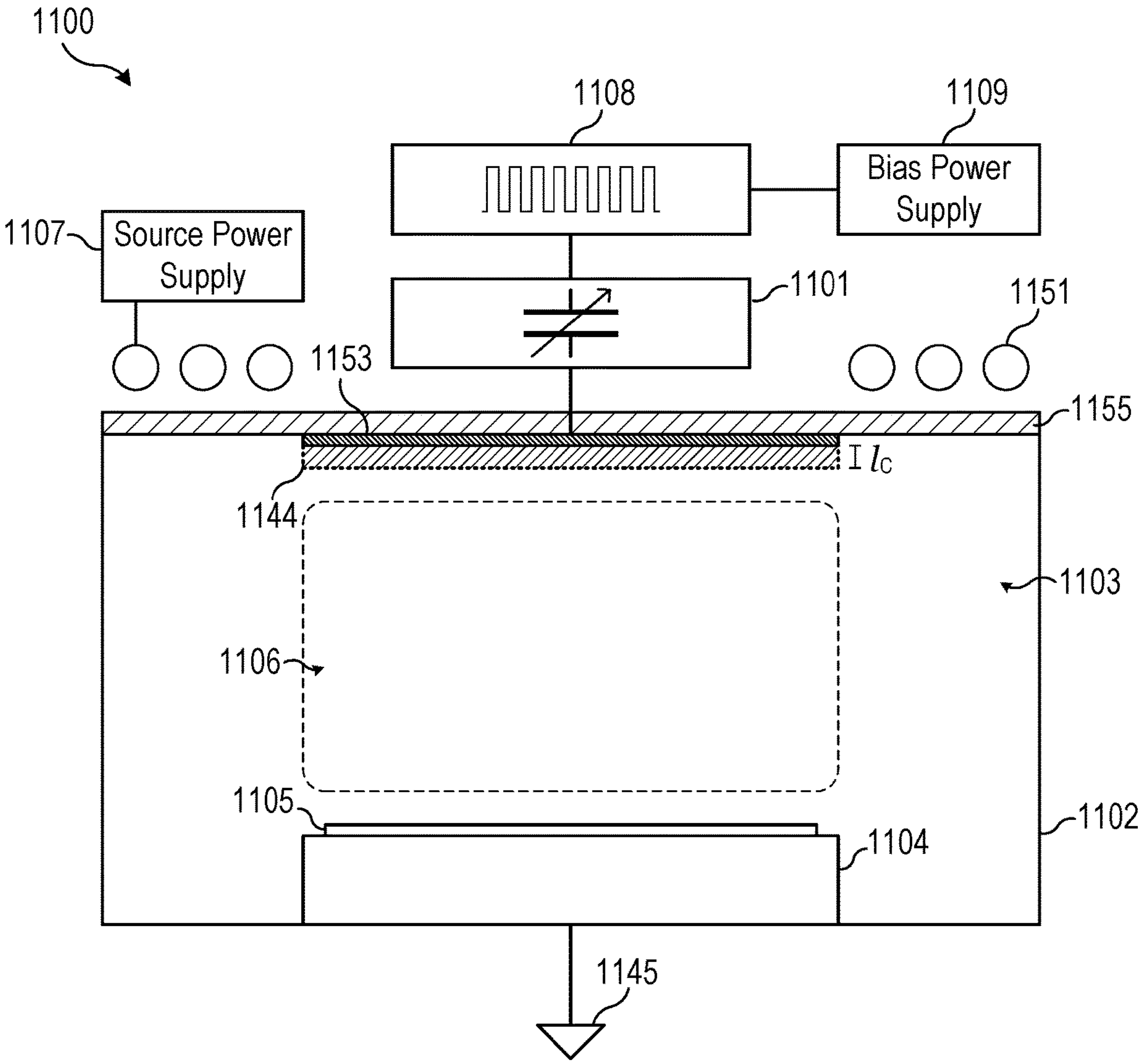
FIG. 11 illustrates a schematic diagram of an example plasma processing apparatus comprising a capacitive pre-coat layer covering an upper electrode, and a tuning circuit coupled to the upper electrode in accordance with an embodiment of the invention.

FIG. 11 illustrates a schematic diagram of an example plasma processing apparatus comprising a capacitive pre-coat layer covering an upper electrode, and a tuning circuit coupled to the upper electrode in accordance with an embodiment of the invention. The plasma processing apparatus of FIG. 11 may be a specific implementation of other plasma processing apparatuses described herein such as the plasma processing apparatus of FIG. 3, for example. Similarly labeled elements may be as previously described.

Referring to FIG. 11, a plasma processing apparatus 1100 includes a substrate holder 1104 configured to support a substrate 1105 and disposed in an interior 1103 of a plasma processing chamber 1102. A source power supply 1107 that is configured to generate plasma 1106 is coupled to a source power coupling element 1151. A tuning circuit 1101 is coupled between a DC pulse generator 1108 and a DC coupling element 1153. A bias power supply 1109 is coupled to the DC pulse generator 1108. A reference potential node 1145 is coupled to the substrate holder 1104.

The plasma processing apparatus 1100 differs from the plasma processing apparatus illustrated in FIG. 3 in that the DC coupling element 1153 is implemented as an upper electrode at the top of the interior 1103 of the plasma processing chamber 1102. The voltage applied by the DC pulse generator 1108 to the DC coupling element 1153 may be positive (as opposed to negative) in order to create a potential gradient that accelerates positive ions towards the substrate 1105 which may be at or near the reference potential. A DC current path then exists from the bias power supply 1109 to the reference potential node 1145.

An optional capacitive pre-coat layer 1144 may be included on the DC coupling element 1153. Additionally, since the reference potential node 1145 is coupled to the substrate holder 1104 rather than a wall of the plasma processing chamber 1102, resistive components may be included between the substrate 1105 and the reference potential node 1145. For example, an optional resistive pre-coat layer (not shown) may be included on the surface of the substrate holder 1104. Alternatively or additionally, resistors may also be included to increase the resistance.

Figure 12:
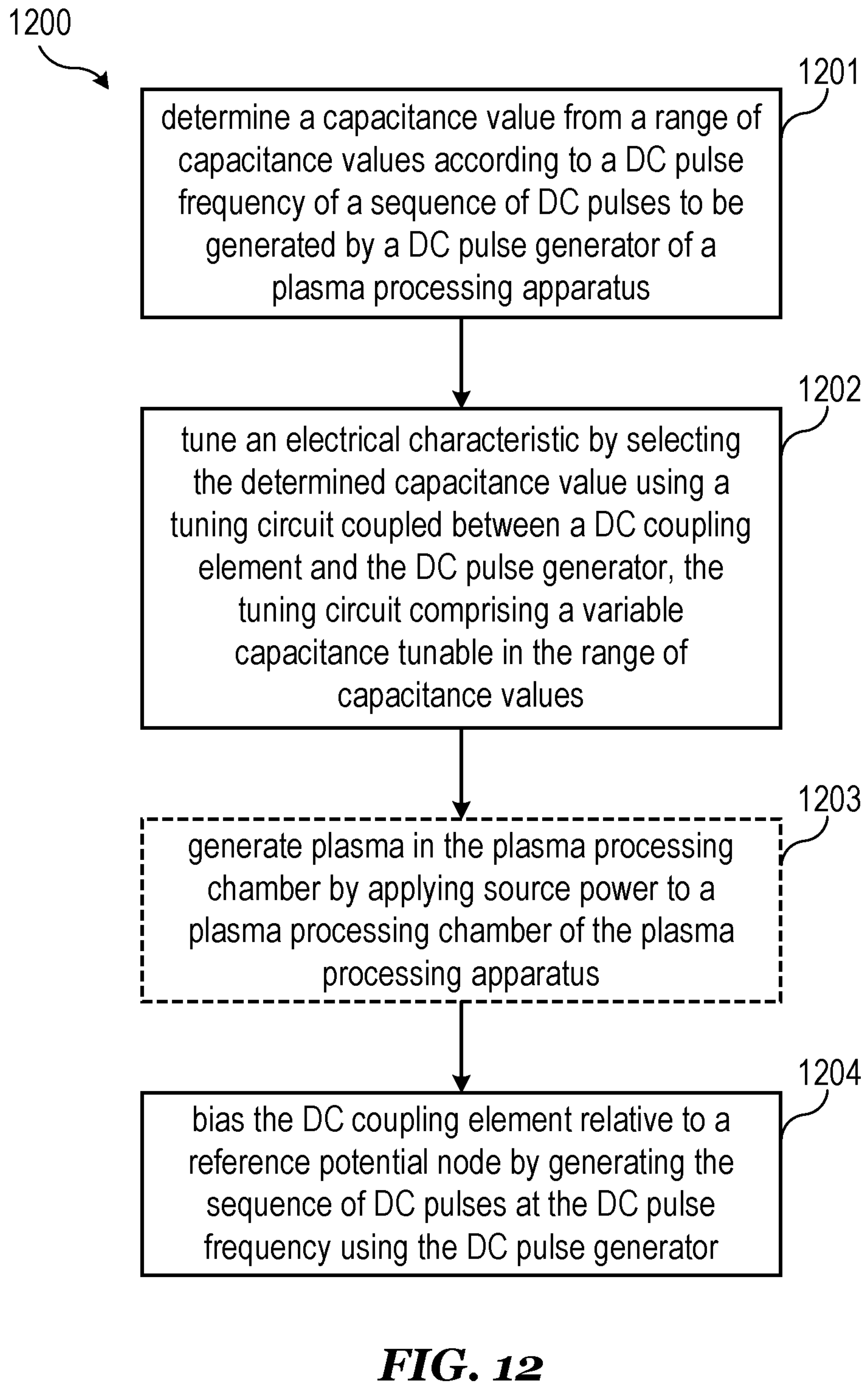
FIG. 12 illustrates an example method of plasma processing in accordance with an embodiment of the invention.

FIG. 12 illustrates an example method of plasma processing in accordance with an embodiment of the invention. The method of FIG. 12 may be combined with other methods and performed using the systems and apparatuses as described herein. For example, the method of FIG. 12 may be combined with any of the embodiments of FIGS. 1-11. Although shown in a logical order, the arrangement and numbering of the steps of FIG. 12 are not intended to be limited. The method steps of FIG. 12 may be performed in any suitable order or concurrently with one another as may be apparent to a person of skill in the art.

Referring to FIG. 12, a step 1201 of a method 1200 of plasma processing includes determining a capacitance value from a range of capacitance values according to a DC pulse frequency of a DC pulse train to be generated by a DC pulse generator of a plasma processing apparatus. Step 1202 includes tuning an electrical characteristic by selecting the determined capacitance value using a tuning circuit coupled between a DC coupling element and the DC pulse generator, the tuning circuit comprising a variable capacitance tunable in the range of capacitance values.

Plasma is optionally generated in a plasma processing chamber of the plasma processing apparatus by applying source power to the plasma processing chamber in optional step 1203. Alternatively, the plasma may already be present in the plasma processing chamber. Step 1204 includes biasing the DC coupling element relative to a reference potential node by generating the DC pulse train at the DC pulse frequency using the DC pulse generator. The DC coupling element may be biased in an afterglow phase of the plasma (e.g. after removal of source power).

Example embodiments of the invention are summarized here. Other embodiments can also be understood from the entirety of the specification as well as the claims filed herein.

Example 1. A plasma processing apparatus including: a plasma processing chamber; a SP coupling element configured to generate plasma in an interior of the plasma processing chamber by coupling source power to the plasma processing chamber; a DC pulse generator configured to generate a DC pulse train at a DC pulse frequency; a substrate holder disposed in the interior of the plasma processing chamber; a DC coupling element coupled to the DC pulse generator; a DC current path including the DC coupling element, the plasma, and a reference potential node in a series configuration, the DC coupling element being configured to bias the substrate holder relative to the reference potential node using the DC pulse train; and a capacitive pre-coat layer disposed between the DC coupling element and the plasma, the capacitive pre-coat layer increasing the RC time constant of the DC current path according to the DC pulse frequency.

Example 2. The plasma processing apparatus of example 1, where the capacitive pre-coat layer increases the RC time constant to at least double the inverse of the DC pulse frequency.

Example 3. The plasma processing apparatus of one of examples 1 and 2, where the capacitance of the capacitive pre-coat layer is about 100 nF.

Example 4. The plasma processing apparatus of one of examples 1 to 3, where a thickness of the capacitive pre-coat layer is about 600 nm.

Example 5. The plasma processing apparatus of one of examples 1 to 4, where the capacitive pre-coat includes silicon, silica, or yttria.

Example 6. The plasma processing apparatus of one of examples 1 to 5, further including: a resistive pre-coat layer disposed on surfaces of the interior of the plasma processing chamber; where the reference potential node is coupled to the plasma processing chamber; where the resistive pre-coat layer is disposed between the plasma and the reference potential node; and where the resistive pre-coat layer further increases the RC time constant of the DC current path according to the DC pulse frequency.

Example 7. The plasma processing apparatus of example 6, where the resistance of the resistive pre-coat layer is about 1 kΩ.

Example 8. The plasma processing apparatus of one of examples 6 and 7, where a thickness of the resistive pre-coat layer is about 100 nm.

Example 9. The plasma processing apparatus of one of examples 6 to 8, where the resistive pre-coat layer includes amorphous carbon, graphitic carbon, a silicon-like material, or a silica-like material.

Example 10. The plasma processing apparatus of one of examples 1 to 9, further including: a tuning circuit coupled between the DC coupling element and the DC pulse generator, the tuning circuit including a variable capacitance.

Example 11. The plasma processing apparatus of one of examples 1 to 10, where the substrate holder is an electrostatic chuck (ESC).

Example 12. The plasma processing apparatus of one of examples 1 to 11, where the DC coupling element is disposed above the substrate holder; and the reference potential node is coupled to the substrate holder.

Example 13. A plasma processing apparatus including: a plasma processing chamber; a SP coupling element configured to generate plasma in an interior of the plasma processing chamber by coupling source power to the plasma processing chamber; a DC pulse generator configured to generate a DC pulse train including a DC pulse frequency; a substrate holder disposed in the interior of the plasma processing chamber; a DC coupling element coupled to the DC pulse generator; a DC current path including the DC coupling element, the plasma, and a reference potential node in a series configuration, the DC coupling element being configured to bias the substrate holder relative to the reference potential node using the DC pulse train; and a tuning circuit coupled between the DC coupling element and the DC pulse generator, the tuning circuit including a variable capacitance, the tuning circuit being configured to tune an RC time constant of the DC current path by varying the variable capacitance according to the DC pulse frequency.

Example 14. The plasma processing apparatus of example 13, where the tuning circuit includes a variable capacitor.

Example 15. The plasma processing apparatus of one of examples 13 and 14, where the tuning circuit includes: a plurality of capacitors; a first single pole switch including an input coupled to either the DC coupling element or the DC pulse generator, and a first output coupled to a first subset of the of plurality of capacitors.

Example 16. The plasma processing apparatus of example 15, where the first single pole switch is a mechanical switch.

Example 17. The plasma processing apparatus of example 16, where the first single pole switch is an electromechanical switch.

Example 18. The plasma processing apparatus of one of examples 15 to 17, where the tuning circuit further includes: a second single pole switch including an input coupled to the DC pulse generator and an output coupled to the first subset of the plurality of capacitors, where the first single pole switch is coupled to the DC coupling element.

Example 19. The plasma processing apparatus of one of examples 15 to 18, where the plurality of capacitors includes a plurality of banks of capacitors coupled in parallel with one another.

Example 20. The plasma processing apparatus of one of examples 15 to 19, where the first single pole switch is a multiple throw switch including a second output coupled to a second subset of the plurality of capacitors.

Example 21. The plasma processing apparatus of example 20, where the first single pole multiple throw switch is a rotary switch.

Example 22. The plasma processing apparatus of one of examples 20 and 21, where the capacitors of the first subset and the capacitors of the second subset are mutually exclusive.

Example 23. The plasma processing apparatus of one of examples 15 to 18, where: the first single pole switch is a single throw switch; and the tuning circuit further includes a second single pole single throw switch including an input coupled to the input of the first single pole single throw switch, and an output coupled to a second subset of the plurality of capacitors.

Example 24. The plasma processing apparatus of one of examples 15 to 23, where the plurality of capacitors includes a plurality of fixed capacitors.

Example 25. The plasma processing apparatus of example 24, where the plurality of capacitors further includes a variable capacitor.

Example 26. The plasma processing apparatus of one of examples 15 to 25, where the first single pole switch includes a second output coupled to either the DC pulse generator or the DC coupling element so that a short circuit path is formed between the DC coupling element and the DC pulse generator when the second output is selected.

Example 27. The plasma processing apparatus of one of examples 13 to 26, further including: a resistive pre-coat layer disposed on surfaces of the interior of the plasma processing chamber; where the reference potential node is coupled to the plasma processing chamber; where the resistive pre-coat layer is disposed between the plasma and the reference potential node; and where the resistive pre-coat layer further increases the RC time constant of the DC current path according to the DC pulse frequency.

Example 28. The plasma processing apparatus of example 27, further including: a capacitive pre-coat layer disposed between the DC coupling element and the plasma, the capacitive pre-coat layer increasing the RC time constant of the DC current path according to the DC pulse frequency.

Example 29. A method of tuning an electrical characteristic of a plasma processing chamber of a plasma processing apparatus, the method including: determining a capacitance value from a range of capacitance values according to a direct current (DC) pulse frequency of a DC pulse train to be generated by a DC pulse generator of the plasma processing apparatus; tuning the electrical characteristic by selecting the determined capacitance value using a tuning circuit coupled between a DC coupling element and the DC pulse generator, the tuning circuit including a variable capacitance tunable in the range of capacitance values; and biasing the DC coupling element relative to a reference potential node by generating the DC pulse train at the DC pulse frequency using the DC pulse generator.

Example 30. The method of example 29, further including: generating plasma in the plasma processing chamber by applying source power to the plasma processing chamber prior to biasing the DC coupling element; and where biasing the DC coupling element includes biasing the DC coupling element in an afterglow of the plasma after removal of the source power.

Example 31. The method of one of examples 29 and 30, where biasing the DC coupling element includes negatively biasing a substrate holder in the plasma processing chamber relative to the reference potential node by generating the DC pulse train at the DC pulse frequency using the DC pulse generator.

Example 32. The method of one of examples 29 to 31, where the electrical characteristic includes an RC time constant of a DC current path including the DC coupling element, a plasma in the plasma processing chamber, and the reference potential node.

Example 33. The method of example 32, where the RC time constant is at least double the inverse of the DC pulse frequency.

Example 34. The method of example 33, where the DC pulse frequency is less than about 400 kHz.

Example 35. The method of example 34, where the DC pulse frequency is less than about 20 kHz.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma processing apparatus comprising:

a plasma processing chamber;

a source power (SP) coupling element configured to generate plasma in an interior of the plasma processing chamber by coupling source power to the plasma processing chamber;

a direct current (DC) pulse generator configured to generate a DC pulse train at a DC pulse frequency;

a substrate holder disposed in the interior of the plasma processing chamber;

a DC coupling element coupled to the DC pulse generator;

a DC current path comprising the DC coupling element, the plasma, and a reference potential node in a series configuration, the DC coupling element being configured to bias the substrate holder relative to the reference potential node using the DC pulse train; and a capacitive pre-coat layer disposed between the DC coupling element and the plasma, the capacitive pre-coat layer increasing the RC time constant of the DC current path according to the DC pulse frequency.

2. The plasma processing apparatus of claim 1, further comprising:

a resistive pre-coat layer disposed on surfaces of the interior of the plasma processing chamber;

wherein the reference potential node is coupled to the plasma processing chamber;

wherein the resistive pre-coat layer is disposed between the plasma and the reference potential node; and wherein the resistive pre-coat layer further increases the RC time constant of the DC current path according to the DC pulse frequency.

3. The plasma processing apparatus of claim 1, further comprising:

a tuning circuit coupled between the DC coupling element and the DC pulse generator, the tuning circuit comprising a variable capacitance.

4. The plasma processing apparatus of claim 1, wherein:

the DC coupling element is disposed above the substrate holder; and the reference potential node is coupled to the substrate holder.

5. A plasma processing apparatus comprising:

a plasma processing chamber;

a source power (SP) coupling element configured to generate plasma in an interior of the plasma processing chamber by coupling source power to the plasma processing chamber;

a direct current (DC) pulse generator configured to generate a DC pulse train comprising a DC pulse frequency;

a substrate holder disposed in the interior of the plasma processing chamber;

a DC coupling element coupled to the DC pulse generator;

a DC current path comprising the DC coupling element, the plasma, and a reference potential node in a series configuration, the DC coupling element being configured to bias the substrate holder relative to the reference potential node using the DC pulse train; and a tuning circuit coupled between the DC coupling element and the DC pulse generator, the tuning circuit comprising a variable capacitance, the tuning circuit being configured to tune an RC time constant of the DC current path by varying the variable capacitance according to the DC pulse frequency.

6. The plasma processing apparatus of claim 5, wherein the tuning circuit comprises:

a plurality of capacitors; and a first single pole switch comprising an input coupled to either the DC coupling element or the DC pulse generator, and a first output coupled to a first subset of the plurality of capacitors.

7. The plasma processing apparatus of claim 6, wherein the tuning circuit further comprises:

a second single pole switch comprising an input coupled to the DC pulse generator and an output coupled to the first subset of the plurality of capacitors, wherein the first single pole switch is coupled to the DC coupling element.

8. The plasma processing apparatus of claim 6, wherein the plurality of capacitors comprises a plurality of banks of capacitors coupled in parallel with one another.

9. The plasma processing apparatus of claim 6, wherein the first single pole switch is a multiple throw switch comprising a second output coupled to a second subset of the plurality of capacitors.

10. The plasma processing apparatus of claim 6, wherein:

the first single pole switch is a single throw switch; and the tuning circuit further comprises a second single pole single throw switch comprising an input coupled to the input of the first single pole single throw switch, and an output coupled to a second subset of the plurality of capacitors.

11. The plasma processing apparatus of claim 6, wherein the plurality of capacitors comprises a fixed capacitor.

12. The plasma processing apparatus of claim 11, wherein the plurality of capacitors comprises a variable capacitor.

13. The plasma processing apparatus of claim 11, wherein the plurality of capacitors comprises only fixed capacitors.

14. The plasma processing apparatus of claim 6, wherein the first single pole switch comprises a second output coupled to either the DC pulse generator or the DC coupling element so that a short circuit path is formed between the DC coupling element and the DC pulse generator when the second output is selected.

15. The plasma processing apparatus of claim 5, further comprising:

a resistive pre-coat layer disposed on surfaces of the interior of the plasma processing chamber;

wherein the reference potential node is coupled to the plasma processing chamber;

wherein the resistive pre-coat layer is disposed between the plasma and the reference potential node; and wherein the resistive pre-coat layer further increases the RC time constant of the DC current path according to the DC pulse frequency.

16. The plasma processing apparatus of claim 15, further comprising:

a capacitive pre-coat layer disposed between the DC coupling element and the plasma, the capacitive pre-coat layer increasing the RC time constant of the DC current path according to the DC pulse frequency.

17. The plasma processing apparatus of claim 6, wherein the tuning circuit comprises no short circuit path between the DC coupling element and the DC pulse generator.

18. The plasma processing apparatus of claim 6, wherein the plurality of capacitors comprises a variable capacitor.

19. The plasma processing apparatus of claim 18, wherein the plurality of capacitors comprises only variable capacitors.

20. A plasma processing apparatus comprising:

a plasma processing chamber;

a source power (SP) coupling element configured to generate plasma in an interior of the plasma processing chamber by coupling source power to the plasma processing chamber;

a direct current (DC) pulse generator configured to generate a DC pulse train at a DC pulse frequency;

a substrate holder disposed in the interior of the plasma processing chamber;

a DC coupling element coupled to the DC pulse generator;

a DC current path comprising the DC coupling element, the plasma, and a reference potential node in a series configuration, the DC coupling element being configured to bias the substrate holder relative to the reference potential node using the DC pulse train; and a capacitive pre-coat layer disposed between the DC coupling element and the plasma, the capacitive pre-coat layer increasing the RC time constant of the DC current path according to the DC pulse frequency, wherein the DC coupling element is disposed in or below the substrate holder, and wherein the reference potential node is coupled to a wall of the plasma processing chamber.

* * * * *